United States Patent
Adachi et al.

(10) Patent No.: US 11,499,994 B2
(45) Date of Patent: Nov. 15, 2022

(54) POWER DISTRIBUTION NETWORK MONITORING SYSTEM AND POWER DISTRIBUTION NETWORK MONITORING DEVICE

(71) Applicant: Omron Corporation, Kyoto (JP)

(72) Inventors: Tatsuya Adachi, Ichinomiya (JP); Hiroaki Takeya, Aichi (JP); Mitsunori Sugiura, Nagoya (JP); Yuji Funasaka, Ichinomiya (JP)

(73) Assignee: Omron Corporation, Kyoto (JP)

( * ) Notice: Subject to any disclaimer, the term of this patent is extended or adjusted under 35 U.S.C. 154(b) by 738 days.

(21) Appl. No.: 16/481,102

(22) PCT Filed: Nov. 17, 2017

(86) PCT No.: PCT/JP2017/041407
§ 371 (c)(1),
(2) Date: Jul. 26, 2019

(87) PCT Pub. No.: WO2018/168078
PCT Pub. Date: Sep. 20, 2018

(65) Prior Publication Data
US 2019/0391184 A1 Dec. 26, 2019

(30) Foreign Application Priority Data
Mar. 15, 2017 (JP) .............................. JP2017-050447

(51) Int. Cl.
*G01R 15/18* (2006.01)
*G01R 19/00* (2006.01)
(Continued)

(52) U.S. Cl.
CPC ........... *G01R 15/18* (2013.01); *G01M 11/081* (2013.01); *G01R 19/0092* (2013.01); *G01R 19/2513* (2013.01); *H02J 13/00* (2013.01)

(58) Field of Classification Search
CPC . G01M 11/081; G01R 15/18; G01R 19/0092; G01R 19/2513; G01R 35/00;
(Continued)

(56) References Cited

U.S. PATENT DOCUMENTS 6,477,475 B1    11/2002    Takaoka et al.
9,742,462 B2 *   8/2017    Bennett .................... H01P 3/16
(Continued)

FOREIGN PATENT DOCUMENTS

JP    S6045899 A    3/1985
JP    H06-178355 A   6/1994
(Continued)

OTHER PUBLICATIONS

Office Action issued in U.S. Appl. No. 16/481,112; dated Apr. 15, 2021 (25 pages).
(Continued)

*Primary Examiner* — Vinh P Nguyen
(74) *Attorney, Agent, or Firm* — Osha Bergman Watanabe & Burton LLP

(57) ABSTRACT

A power distribution network monitoring system includes a plurality of measuring instruments that are installed at predetermined positions on power lines constituting a power distribution network and configured to perform electrical measurement of the power lines; a data collection relay configured to receive data related to measurement results from the plurality of measuring instruments; an imaging unit that is disposed near the data collection relay and configured to capture an image including the data collection relay; an abnormality detector configured to use the image captured by the imaging unit to detect an abnormality in the data collection relay; and a storage unit configured to store image data taken by the imaging unit. The image data consists of a single image previously captured by the imaging unit. The (Continued)

abnormality detector compares the latest image captured by the imaging unit and the image data stored by the storage unit and determines whether or not an appearance of the data collection relay changes. If it is determined that there is no change in the appearance of the data collection relay, the image data in the storage unit is updated with the latest image captured by the imaging unit.

13 Claims, 13 Drawing Sheets

(51) Int. Cl.
*H02J 13/00* (2006.01)
*G01R 19/25* (2006.01)
*G01M 11/08* (2006.01)

(58) Field of Classification Search
CPC .............. H02J 13/00; H02J 13/00001; H02J 13/00002; H02J 13/00032; H02J 13/00034; Y02E 60/00; Y04S 10/30; Y04S 10/40
See application file for complete search history.

(56) References Cited

U.S. PATENT DOCUMENTS

| | | | | |
|---|---|---|---|---|
| 9,800,327 | B2* | 10/2017 | Gerszberg | H02J 13/00022 |
| 9,912,382 | B2* | 3/2018 | Bennett | H04B 3/54 |
| 10,009,067 | B2* | 6/2018 | Birk | H02J 13/00007 |
| 10,243,784 | B2* | 3/2019 | Gerszberg | H04B 10/25752 |
| 10,951,059 | B2* | 3/2021 | Adachi | H02J 13/00022 |
| 2008/0109387 | A1* | 5/2008 | Deaver | G06Q 50/06 705/412 |
| 2015/0212138 | A1 | 7/2015 | Tsuchiya et al. | |
| 2016/0025778 | A1 | 1/2016 | Tokusaki et al. | |
| 2016/0156227 | A1 | 6/2016 | Nagashima et al. | |

FOREIGN PATENT DOCUMENTS

| | | | |
|---|---|---|---|
| JP | H06215275 | A | 8/1994 |
| JP | H11-212637 | A | 8/1999 |
| JP | 2000-201441 | A | 7/2000 |
| JP | 20000201441 | A * | 7/2000 |
| JP | 2003-50620 | A | 2/2003 |
| JP | 2003-250231 | A | 9/2003 |
| JP | 2003250231 | A * | 9/2003 |
| JP | 2008-22676 | A | 1/2008 |
| JP | 2010-4263 | A | 1/2010 |
| JP | 2010-183734 | A | 8/2010 |
| JP | 2011-211820 | A | 10/2011 |
| JP | 2012-215969 | A | 11/2012 |
| JP | 2012-249445 | A | 12/2012 |
| JP | 2014-36482 | A | 2/2014 |
| JP | 2014-178238 | A | 9/2014 |
| JP | 2016-95683 | A | 5/2016 |

OTHER PUBLICATIONS

Notification of Reasons for Refusal issued in Japanese Application No. 2017-050431, dated Apr. 28, 2020 (9 pages).
International Search Report issued in Application No. PCT/JP2017/041407, dated Jan. 9, 2018 (2 pages).
Written Opinion issued in International Application No. PCT/JP2017/041407, dated Jan. 9, 2018 (4 pages).
International Search Report issued in corresponding Application No. PCT/JP2017/041396, dated Feb. 6, 2018 (2 pages).
Written Opinion issued in corresponding International Application No. PCT/JP2017/041396, dated Feb. 6, 2018 (4 pages).
International Preliminary Report on Patentability issued in corresponding International Application No. PCT/JP2017/041396, dated Jan. 31, 2019 (5 pages).
Office Action issued in Japanese Application No. 2017-050447; dated Nov. 4, 2020 (15 pages).

* cited by examiner

Setting information

| Area code | A01 | | |
|---|---|---|---|
| Relay management code | A01_01 | ... | A01_m |
| Camera ID | CA01_01 | ... | CA01_m |
| CT sensor ID | 001 | 002 | ... | 00n |

| Area code | A02 | | |
|---|---|---|---|
| Relay management code | A02_01 | A02_02 | ... | A02_m |
| Camera ID | CA02_01 | CA02_02 | ... | CA02_m |
| CT sensor ID | 001 | 002 | ... | 00n |

| Time information | 2017/2/6/09:58:55 |
|---|---|

FIG. 6

Measurement information

| Area code | Relay management code | CT sensor ID | Time information | Measurement result |
|---|---|---|---|---|
| A01 | A01_01 | 001 | 2017/2/6/09:02:30 | 100mA |
| | | | 2017/2/6/09:08:30 | 101mA |
| | | | 2017/2/6/09:14:30 | 105mA |
| | | | 2017/2/6/09:20:30 | 107mA |
| | | | 2017/2/6/09:26:30 | 106mA |
| | | | 2017/2/6/09:32:30 | 104mA |
| | | | 2017/2/6/09:38:30 | 108mA |
| | | | 2017/2/6/09:44:30 | 103mA |
| | | | 2017/2/6/09:50:30 | 105mA |
| | | | 2017/2/6/09:56:30 | 104mA |
| | | 002 | 2017/2/6/09:00:00 | abnormal |
| | A01_02 | : | : | : |
| A02 | A02_01 | 001 | 2017/2/6/09:08:30 | 95mA |

FIG. 7

| Camera ID | Time information | Camera image |
|---|---|---|
| CA01_01 | 2017/2/6/09:00:00 | |
| CA01_02 | 2017/2/6/09:00:10 | |

FIG. 8

Setting information

| Relay management code | A01_01 | | | |
|---|---|---|---|---|
| CT sensor ID | 001 | 002 | ... | 00n |
| Time information | 2017/2/6/09:58:55 | | | |

FIG. 9

| CT sensor ID | Time information | Measurement result |
|---|---|---|
| 001 | 2017/2/6/09:02:30 | 100mA |
| | 2017/2/6/09:08:30 | 101mA |
| | 2017/2/6/09:14:30 | 105mA |
| | 2017/2/6/09:20:30 | 107mA |
| | 2017/2/6/09:26:30 | 106mA |
| | 2017/2/6/09:32:30 | 104mA |
| | 2017/2/6/09:38:30 | 108mA |
| | 2017/2/6/09:44:30 | 103mA |
| | 2017/2/6/09:50:30 | 105mA |
| | 2017/2/6/09:56:30 | 104mA |
| 002 | 2017/2/6/09:03:42 | 95mA |
| | 2017/2/6/09:09:42 | 98mA |
| 003 | 2017/2/6/09:01:19 | 99mA |
| : | : | : |

FIG. 10

Position information management table

| Relay management code | Position code |
|---|---|
| A01_01 | 35.323890,136.758432 |
| ... | ... |
| A01_m | 35.324471,136.761068 |
| A02_01 | 35.170220,136.882467 |
| ... | ... |

(a)

| Camera ID | Position code |
|---|---|
| CA01_01 | 35.323890,136.758433 |
| ... | ... |
| CA01_m | 35.324471,136.761069 |
| CA02_01 | 35.170220,136.882468 |
| ... | ... |

(b)

| Area code | CT sensor ID | Position code |
|---|---|---|
| A01 | 001 | 35.323890,136.758434 |
| | ... | ... |
| | 00m | 35.324471,136.761070 |
| A02 | 001 | 35.170220,136.882469 |
| ... | | ... |

POWER DISTRIBUTION NETWORK MONITORING SYSTEM AND POWER DISTRIBUTION NETWORK MONITORING DEVICE

TECHNICAL FIELD

The present invention relates to a power distribution network monitoring system and a power distribution network monitoring device for detecting abnormalities in a power distribution network.

BACKGROUND ART

Recent years have seen the use of a measurement device that is attached to the power lines constituting a power distribution network and measures a physical quantity by converting it into a current value with a current transformer (CT).

For instance, Patent Literature 1 discloses a configuration of a measurement device for accurately sensing the current flowing through a power line that is part of a power distribution network.

By constructing a power distribution network monitoring system that makes use of such a measurement device to enable electrical measurement of the power lines that make up the power distribution network, a system can be provided for dealing with electricity theft, in which power is taken off from the power lines without permission, for example.

CITATION LIST

Patent Literature

Patent Literature 1: JP-A 2014-178238

SUMMARY

Technical Problem

However, the following problems are encountered with the above-mentioned conventional power distribution network monitoring system.

With the power distribution network monitoring system disclosed in the above-mentioned publication, there is the risk that the data collection relays or the like used for receiving a measurement result from a current sensor and transmitting it to a management center or the like may be broken, destroyed, stolen, or the like due to natural phenomena such as storms or to mischief perpetrated by people.

An object of the present invention is to provide a power distribution network monitoring system and a power distribution network monitoring device capable of effectively detecting the occurrence of abnormalities related to data collection relays that receive data related to measurement results from measuring instruments installed on power lines.

Solution to Problem

The power distribution network monitoring system according to the first invention comprises a plurality of measuring instruments, a data collection relay, an imaging unit, and an abnormality detector. The measuring instruments are installed at predetermined positions on the power lines constituting a power distribution network and perform electrical measurement of the power lines. The data collection relay receives data related to measurement results from the plurality of measuring instruments. The imaging unit is disposed near the data collection relay and captures an image including the data collection relay. The abnormality detector uses the image captured by the imaging unit to detect an abnormality in the data collection relay.

Here, in a system that detects various abnormalities that occur in a data collection relay by using an image that includes the data collection relay that receives data related to measurement results from the measuring instruments installed on the power lines constituting a power distribution network, an abnormality detector receives image data including the data collection relay, and detects the presence or absence of an abnormality from a change in the appearance of the data collection relay and its housing.

That is, with this power distribution network monitoring system, for example, images including the data collection relay captured by the imaging unit at regular time intervals are used, and when a change occurs in the appearance of the data collection relay or its housing, it is determined that some kind of abnormality has occurred in the data collection relay.

Here, for example, one data collecting relay is provided for a plurality of measuring instruments, and is provided in order to receive data related to the results measured by the plurality of measuring instruments, and transmit this data to a management center or the like.

Abnormalities in the data collection relay include, for example, damage, theft, or failure of a data collection relay, damage or theft of the housing in which the data collection relay is installed, and so forth.

The imaging unit is an imaging means such as a monitoring camera, for example, and may be provided in a one-to-one correspondence with respect to the data collection relay that is used to detect the occurrence of an abnormality, or just one imaging unit may be provided for a plurality of data collection relays.

Also, communication between the imaging unit and the abnormality detector is not limited to direct communication, and may be indirect communication via a relay or the like. Furthermore, communication between the imaging unit and the abnormality detector may be wireless communication or wired communication.

Furthermore, the abnormality detector may be provided inside the measuring instrument, the data collection relay, or the imaging unit, or may be provided inside some other device.

Consequently, when the data collection relay is normal, no change in the appearance of the data collection relay is observed, but when a change in appearance is detected by comparing the image captured immediately before with the latest image, it is concluded that some kind of abnormality has occurred in the data collection relay, and it is determined that there is an abnormality.

As a result, an abnormality occurring in the data collection relay that receives data related to the measurement results from the measuring instruments installed on the power lines constituting the power distribution network can be effectively detected by using an image captured by the imaging unit disposed near the data collection relay.

The power distribution network monitoring system according to the second invention is the power distribution network monitoring system according to the first invention, wherein the imaging units are provided in a one-to-one correspondence with respect to the data collection relays.

Here, imaging units are disposed in a one-to-one correspondence with data collection relays that receive data related to measurement results from a plurality of measuring instruments attached to the power lines constituting a power distribution network.

Consequently, compared to a configuration in which a plurality of data collection relays are imaged by a single imaging unit, providing a dedicated imaging unit for each data collection relay allows changes in the appearance and so forth of the data collection relay to be more effectively detected, so as to detect abnormalities.

The power distribution network monitoring system according to the third invention is the power distribution network monitoring system according to the first or the second invention, wherein the imaging unit transmits unique ID information assigned to each of the imaging units, along with data for the image.

Here, in addition to the image data transmitted from the imaging unit, unique ID information assigned to each imaging unit is also transmitted.

Consequently, when there is a change in the appearance or the like of a data collection relay based on the image received from the imaging unit, the abnormality detector confirms the ID information of the imaging unit in which the appearance or the like has changed, which makes it possible to easily recognize which imaging unit imaged the data collection relay in which an abnormality has occurred.

The power distribution network monitoring system according to the fourth invention is the power distribution network monitoring system according to any of the first to the third inventions, wherein the abnormality detector receives data related to the measurement result measured in the measuring instrument from the data collection relay, determines whether or not the data has been received a predetermined number of times within a predetermined length of time, and detect abnormalities related to the measuring instruments.

Here, for example, data about the measurement result in the measuring instrument is set to be transmitted from the data collection relay to the abnormality detector each time a predetermined length of time elapses, and if the measurement results have not be received a predetermined number of times (such as ten) within a predetermined length of time (such as 60 minutes), it is concluded that some kind of abnormality has occurred in the measuring instrument, the data collection relay, or the power distribution network.

Here, in addition to a power outage in the power distribution network, examples of abnormalities that can occur in the power distribution network include failure, damage, or theft of the measuring instrument or data collection relay, and a communication failure between the data collection relay and the abnormality detector.

Also, the data related to the measurement result transmitted from the data collection relay may be, for example, data about the measurement result for the current or voltage of the power line, or data about the effective value of AC calculated from the measurement value.

Also, communication between the data collection relay and the abnormality detector may be wireless communication or wired communication.

Consequently, when the measuring instrument, the data collection relay, and the power distribution network are normal, the data of the measurement result can be received a predetermined number of times within a predetermined length of time, but if it is not received a predetermined number of times, it is concluded that some kind of abnormality has occurred, and it is determined that there is an abnormality.

As a result, in addition to the detection of abnormalities using an image, the occurrence of abnormalities can also be accomplished depending on whether or not data related to the measurement result has been properly received, making it possible to detect the occurrence of abnormalities in the power distribution network over a wider range.

The power distribution network monitoring system according to the fifth invention is the power distribution network monitoring system according to the fourth invention, wherein the plurality of measuring instruments perform electrical measurement of the power lines each time a predetermined length of time elapses.

Here, a plurality of measuring instruments installed in the power lines constituting the power distribution network measure the current, voltage, etc., of the power lines each time a predetermined length of time has elapsed.

Consequently, measurement results measured at predetermined time intervals are received from a plurality of measuring instruments by the abnormality detector via the data collection relay, so when some kind of abnormality occurs in the power distribution network, the occurrence of that abnormality can be easily detected by confirming how many times the measurement result has been received.

The power distribution network monitoring system according to the sixth invention is the power distribution network monitoring system according to the fourth or fifth invention, wherein the measuring instruments transmit unique ID information assigned to each of the measuring instruments, along with data related to the measurement result.

Here, in addition to the data related to the measurement result, the measuring instruments also transmit unique ID information assigned to each measuring instrument.

Consequently, when the abnormality detector does not receive data the predetermined number of times within the predetermined length of via through the data collecting relay, which measuring instrument is related to the occurrence of the abnormality can be easily confirmed by the abnormality detector by confirming the ID information of the measuring instrument that has not received the data the predetermined number of times.

The power distribution network monitoring system according to the seventh invention is the power distribution network monitoring system according to the fourth or fifth invention, wherein the measuring instrument transmits position information indicating the place where the measuring instrument is installed, along with data related to the measurement result.

Here, in addition to the data related to the measurement result, the measuring instrument also transmits position information indicating the installation location of the measuring instrument.

Consequently, if the data has not been received the predetermined number of times within the predetermined length of time via the data collection relay, the abnormality detector confirms the position information about the installation position of the measuring instrument that has not received the data the predetermined number of times, which makes it possible to easily recognize at which location the measuring instrument related to the occurrence of an abnormality is installed.

The power distribution network monitoring system according to the eighth invention is the power distribution network monitoring system according to the fourth or fifth invention, wherein the measuring instrument transmits time information indicating the date and time when the measurement was performed in the measuring instrument, along with data related to the measurement result.

Here, in addition to the data related to the measurement result, the measuring instrument also transmits information about the time at which the measurement was performed by the measuring instrument.

Consequently, if the data has not been received the predetermined number of times within the predetermined length of time via the data collection relay, the abnormality detector confirms a blank in the measurement time of the measuring instrument in which data has not been received the predetermined number of times, which makes it possible to easily recognize the time at which the abnormality occurred.

The power distribution network monitoring system according to the ninth invention is the power distribution network monitoring system according to any of the first to the eighth inventions, wherein the data collection relay includes a first data collection relay that receives data related to the measurement results from the plurality of measuring instruments installed in a first area, and a second data collection relay that receives data related to the measurement results from the plurality of measuring instruments installed in a second area.

Here, one data collection relay (the first or second data collection relay) is installed in each area (the first and second areas) in which the plurality of measuring instruments are installed.

Consequently, the power distribution network can be divided into a plurality of areas, and abnormalities managed in each, by confirming in which area is installed the data collection relay connected to the measuring instrument and the imaging unit from which the data has been received.

The power distribution network monitoring system according to the tenth invention is the power distribution network monitoring system according to any of the first to the ninth inventions, further comprising a storage unit that stores image data received from the imaging unit, data related to the measurement results of the plurality of measuring instruments received from the data collection relay, and a detection result of the abnormality.

Here, the power distribution network monitoring system is provided with a storage unit for storing the image data received from the imaging unit, the data related to the measurement results of the plurality of measurement components received from the data collection relay, and the detection result of the abnormality.

Consequently, it is possible to refer to past images, data related to measurement results, and the detection results of abnormalities and to take measures such as inspecting and repairing the data collection relay or the measuring instrument in which the abnormality has occurred.

The power distribution network monitoring system according to the eleventh invention is the power distribution network monitoring system according to any of the first to the tenth inventions, wherein the abnormalities include failure, theft, or damage of the data collection relay or measurement instrument, a power outage in the power distribution network, and communication failure between the measurement instrument, the data collection relay, and the abnormality detector.

Here, examples of abnormalities that are detected by this power distribution network monitoring system include failure, theft, or damage of a data collection relay that can be detected using an image, failure, theft, or damage of a measuring instrument or a data collection relay that can be detected from data related to the measurement results received from the measuring instruments, a power outage in the power distribution network, and communication failure between the measuring instruments, the data collection relays, and the abnormality detector.

Consequently, when some kind of abnormality occurs in the power distribution network, the occurrence of various kinds of abnormality can be easily detected by checking the image captured by the imaging unit or the number of receptions from the data collection relay.

The power distribution network monitoring system according to the twelfth invention is the power distribution network monitoring system according to any of the first to the eleventh inventions, further comprising a reporting unit that gives a report related to an abnormality in the event that the abnormality detector determines that there is an abnormality.

Here, when the abnormality detector determines that there is an abnormality, the reporting unit reports that an abnormality has occurred.

Here, the method for reporting by the reporting unit includes displaying text information advising of the occurrence of an abnormality on the display unit, and emitting voice information or an alarm sound.

Consequently, a manager who has received a report from the reporting unit can take measures such as inspecting and repairing the measuring instrument or data collection relay in which the abnormality has occurred.

The power distribution network monitoring device according to the thirteenth invention comprises an imaging unit and an abnormality detector. The imaging unit is disposed near a data collection relay, which is installed at a predetermined position on a power line constituting a power distribution network and receives data related to measurement results from a plurality of measuring instruments that perform electrical measurement of the power line, and captures an image that includes the data collection relay. The abnormality detector uses the image captured by the imaging unit to detect an abnormality in the data collection relay.

Here, in a device that detects various abnormalities that occur in a data collection relay, which receives data related to measurement results from measuring instruments installed on power lines constituting a power distribution network, by using an image that includes the data collection relay, the abnormality detector receives image data including the data collection relay, and determines whether or not there is an abnormality from a change in the appearance of the data collection relay or its housing.

That is, this power distribution network monitoring device uses images including the data collection relay that have been captured by the imaging unit at predetermined time intervals, for example, and determines that some kind of abnormality has occurred in the data collection relay if there is a change in the appearance of the data collection relay or its housing.

Here, one data collecting relay is provided for a plurality of measuring instruments, for example, and is provided to receive data related to the results measured by the plurality of measuring instruments, and transmit this data to a management center or the like.

Abnormalities in the data collection relay include, for example, damage, theft, or failure of the data collection relay, and damage or theft of the housing in which the data collection relay is installed.

Also, the imaging unit may be an imaging means such as a monitoring camera, for example, and may be provided in a one-to-one correspondence with respect to the data collection relay that is to be monitored to detect the occurrence of abnormalities, or one imaging unit may be provided to a plurality of data collection relays.

Also, communication between the imaging unit and the abnormality detector is not limited to direct communication, and may instead be indirect communication via a relay or the like. Furthermore, communication between the imaging unit and the abnormality detector may be wireless communication or wired communication.

Furthermore, the abnormality detector may be provided inside the measuring instrument, the data collection relay, or the imaging unit, or may be provided inside some other device.

Consequently, if a data collection relay is normal, there will be no change in the appearance of the data collection relay, but if a comparison of the image captured immediately before and the latest image reveals a change in appearance, it is concluded that some kind of abnormality has occurred in the data collection relay, it is determined that there is an abnormality.

As a result, abnormalities occurring in the data collection relays that receive data related to the measurement results from the measuring instruments installed on the power lines constituting the power distribution network can be effectively detected by using images captured by the imaging units disposed near the data collection relays.

Advantageous Effects

With the power distribution network monitoring system according to the present invention, the occurrence of abnormalities related to data collection relays installed on power lines can be effectively detected.

BRIEF DESCRIPTION OF DRAWINGS

FIG. 6 is a table showing setting information stored in a management database of the power management center included in the power distribution network monitoring system in FIG. 1;

FIG. 7 is a table showing measurement information stored in a management database of the power management center included in the power distribution network monitoring system in FIG. 1;

FIG. 8 is a table showing information about camera images stored in a management database of the power management center included in the power distribution network monitoring system in FIG. 1;

FIG. 9 is a table showing setting information stored in a management database of a data collection relay included in the power distribution network monitoring system in FIG. 1;

FIG. 10 is a table showing measurement information stored in the management database of a data collection relay included in the power distribution network monitoring system in FIG. 1;

FIGS. 16A to 16C show management tables of position information for the data collection relays, cameras, and CT sensors, which is stored in the management database of a power management center included in the power distribution network monitoring system according to yet another embodiment of the present invention.

DESCRIPTION OF EMBODIMENTS

The power distribution network monitoring system according to an embodiment of the present invention is described below with reference to FIGS. 1 to 14.

Configuration of Power Distribution Network System 10

Figure 1:
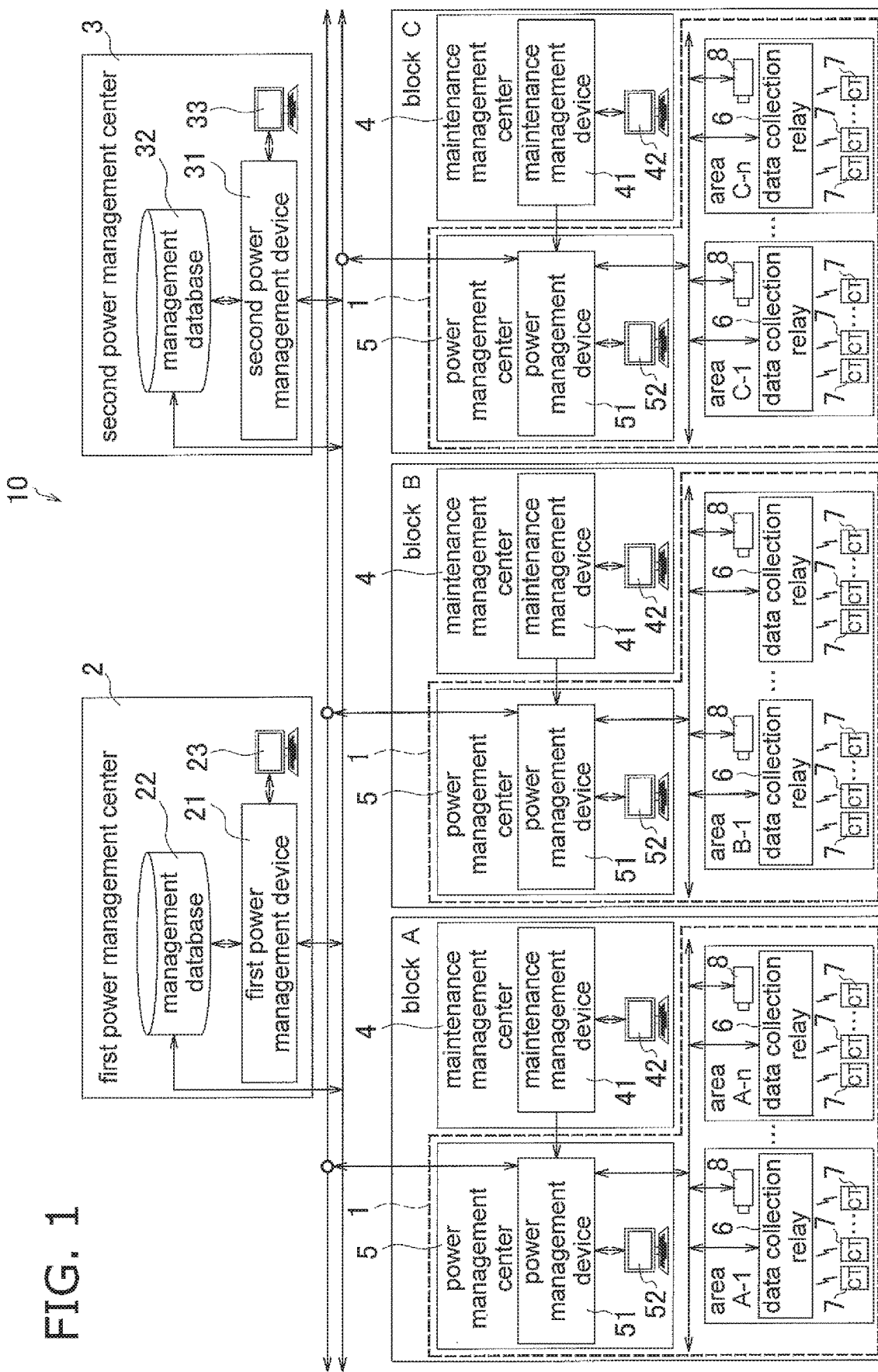
FIG. 1 is a block diagram of the configuration of a power distribution network system including the power distribution network monitoring system according to an embodiment of the present invention.

FIG. 1 is a block diagram of the configuration of a power distribution network system 10 including a power distribution network monitoring system 1 according to an embodiment of the present invention.

The power distribution network monitoring system 1 in this embodiment is provided to the power distribution network system 10. The power distribution network monitoring system 1 receives measurement data from a plurality of current transformer (CT) sensors (an example of a measuring instrument) 7 installed at predetermined positions on distribution lines (an example of a power line) constituting a power distribution network, uses images captured by cameras (imaging units) 8 installed near data collection relays 6 that transmit to a power management center 5, and thereby detect abnormalities. Also, in this embodiment, in addition to abnormality determination using the images captured by the cameras 8, a determination of abnormality in the power distribution network is determined according to whether or not a measurement result from a CT sensor 7 has been received a predetermined number of times (such as ten times) within a predetermined length of time (such as 60 minutes).

A first power management center 2 and a second power management center 3 are provided to the power distribution network system 10 of this embodiment. The first power management center 2 manages the power distribution network in blocks A and B. The second power management center 3 manages the power distribution network in block C.

Here, the first power management center 2 and the second power management center 3 are, for example, management centers provided to Kansai Electric Power, Chubu Electric Power, or the like. Also, blocks A and B indicate, for example, prefectures covered by Kansai Electric Power, such as Osaka Prefecture or Nara Prefecture, and block C indicates prefectures covered by Chubu Electric Power, such as Aichi Prefecture.

The power distribution network system 10 of this embodiment comprises a power distribution network monitoring system 1 and a maintenance management center 4 in each of the blocks A, B, and C.

The power distribution network monitoring system 1 monitors the power distribution network 100 (see FIG. 2) in each block and detects abnormalities. The maintenance management center 4 performs maintenance management for each block on the basis of the detection result from the power distribution network monitoring system 1. The power distribution network monitoring system 1 has a power management center 5, a plurality of data collection relays 6, a plurality of CT sensors 7, and cameras (imaging units) 8.

The power management center 5 manages the power in each block and detects abnormalities in the power distribution network 100 (see FIG. 2) within a block.

The data collection relays 6 collect measurement results from the CT sensors 7, and so forth.

A plurality of CT sensors 7 are installed in each of the electrical areas flowing through the distribution line, and measure the current of the distribution line. Data related to the current value of the distribution line measured by the CT sensor 7 is sent to the power management center 5 via the data collection relay 6. The power management center 5 detects an abnormality on the basis of data indicating the measurement result of this current value.

The camera 8 is disposed near the data collection relay 6 and captures an image including the data collection relay 6 at predetermined time intervals. The image data captured by the camera 8 is transmitted to the power management center 5. The power management center 5 uses two images captured by the camera 8 at predetermined time intervals to detect an abnormality from a change in the appearance of the data collection relay 6.

Abnormality detection in the power management center 5 will be described in detail below.

Here, the area shown in FIG. 1 indicates, for example, a section transmitted from a predetermined substation in a block, or a municipal section such as a city or a town.

In block A, one data collection relay 6 is provided for each of a plurality of areas A-1 to A-n, and the data of a plurality of CT sensors 7 installed in one area is collected by a single data collection relay 6. In block A, one camera 8 is disposed near one data collecting relay 6 provided for each of the plurality of areas A-1 to A-n, and the camera 8 captures an image including the data collection relay 6.

In block B, a plurality of data collection relays 6 are provided in one area B-1, and the data of the plurality of CT sensors 7 installed in one area is collected by a plurality of data collection relays 6. In the case of block B, the plurality of CT sensors 7 are divided into groups, and each data collection relay 6 collects data from the plurality of CT sensors 7 belonging to that group. In block B, one camera 8 is disposed near each of the plurality of data collection relays 6 provided in one area B-1, and the cameras 8 capture images including the data collection relays 6.

As shown in FIG. 1, only one data collecting relay 6 may be provided in an area, or a plurality may be provided.

Installation of Data Collection Relays 6, CT Sensors 7, and Cameras 8

Figure 2:
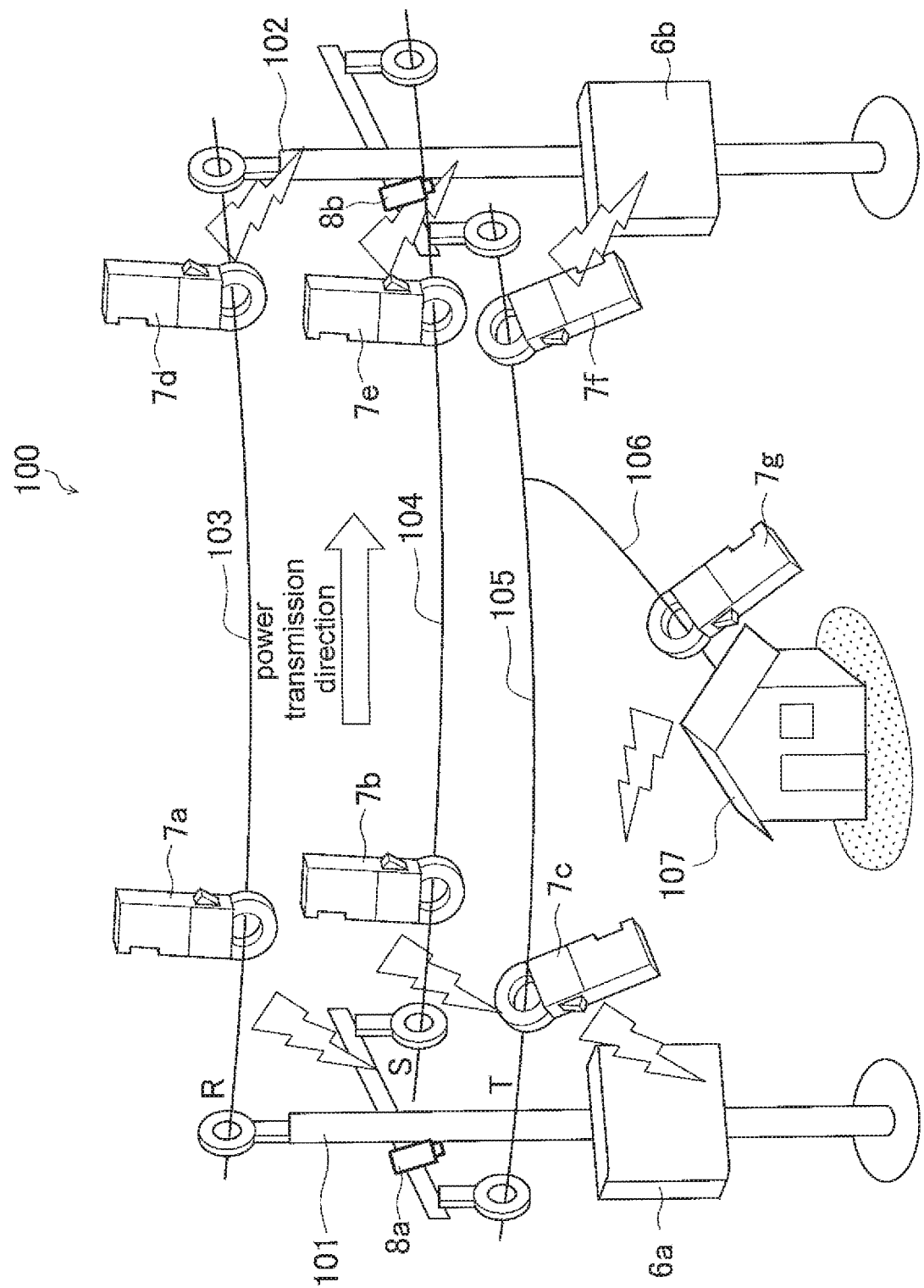
FIG. 2 shows a state in which CT sensors, cameras, and data collection relays included in the power distribution network monitoring system in FIG. 1 are attached to power lines constituting a power distribution network.

FIG. 2 shows the installation locations of the data collection relays 6, the CT sensors 7, and the cameras 8 in the power distribution network 100. In FIG. 2, a power pole 101 on the upstream side in the power transmission direction and a power pole 102 on the downstream side are shown. Distribution lines 103, 104, and 105, serving as three trunk lines constituting three phases of RTS, are strung between the power pole 101 and the power pole 102.

The distribution line 103 is an R-phase distribution line. The distribution line 104 is a T-phase distribution line. The distribution line 105 is an S-phase distribution line. Also, a distribution line 106 branches off from the distribution line 105 as a branch line, and is connected to the electrical box of a house 107.

A data collection relay 6 is installed on each of the power poles 101 and 102. In order to distinguish them by location, the data collection relay 6 installed on the power pole 101 is numbered 6a, and the data collection relay 6 installed on the power pole 102 is 6b.

The CT sensors 7 are a clamp type, and are detachably installed on a distribution line (an example of a power line). The CT sensors 7 are installed near the power pole 101 and near the power pole 102 on each of the distribution lines 103, 104, and 105

A CT sensor 7 is also installed near the house 107 on the distribution line 106. Here, a to f are added to the reference numbers of the CT sensors 7 so that they can be distinguished by their location in the description that follows.

More specifically, the CT sensor 7 installed near the power pole 101 on the distribution line 103 is labeled 7a, and the CT sensor 7 installed near power pole 102 on the distribution line 103 is 7d. The CT sensor 7 installed near the power pole 101 on the distribution line 104 is labeled 7b, and the CT sensor 7 installed near the power pole 102 on the distribution line 104 is 7e. The CT sensor 7 installed near the power pole 101 on the distribution line 105 is labeled 7c, and the CT sensor 7 near the power pole 102 on the distribution line 105 is 7f. The CT sensor 7 installed on the distribution line 106 is labeled 7g.

In FIG. 2, the measurement data of the CT sensors 7a, 7b, 7c, and 7g is transmitted to the data collection relay 6a, and the data of the CT sensors 7d, 7e, and 7f is transmitted to the data collection relay 6b. Communication between the CT sensors 7 and the data collection relays 6 is performed wirelessly as discussed below.

A camera 8 is installed near the data collection relay 6a installed on the power pole 101, and another near the data collection relay 6b installed on the power pole 102.

More specifically, the camera 8 disposed near the data collection relay 6a installed on the power pole 101 is referred to as the camera 8a, and the camera 8 disposed near the data collection relay 6b installed on the power pole 102 is the camera 8b.

The camera 8a is attached to the power pole 101 so as to face the direction of the data collection relay 6a, and captures an image including the data collection relay 6a. The camera 8b, meanwhile, is attached to the power pole 102 so as to face the direction of the data collection relay 6b, and captures an image including the data collection relay 6b.

First and Second Power Management Centers 2 and 3

As shown in FIG. 1, the first power management center 2 has a first power management device 21, a management database 22, and a display unit 23.

Figure 3:
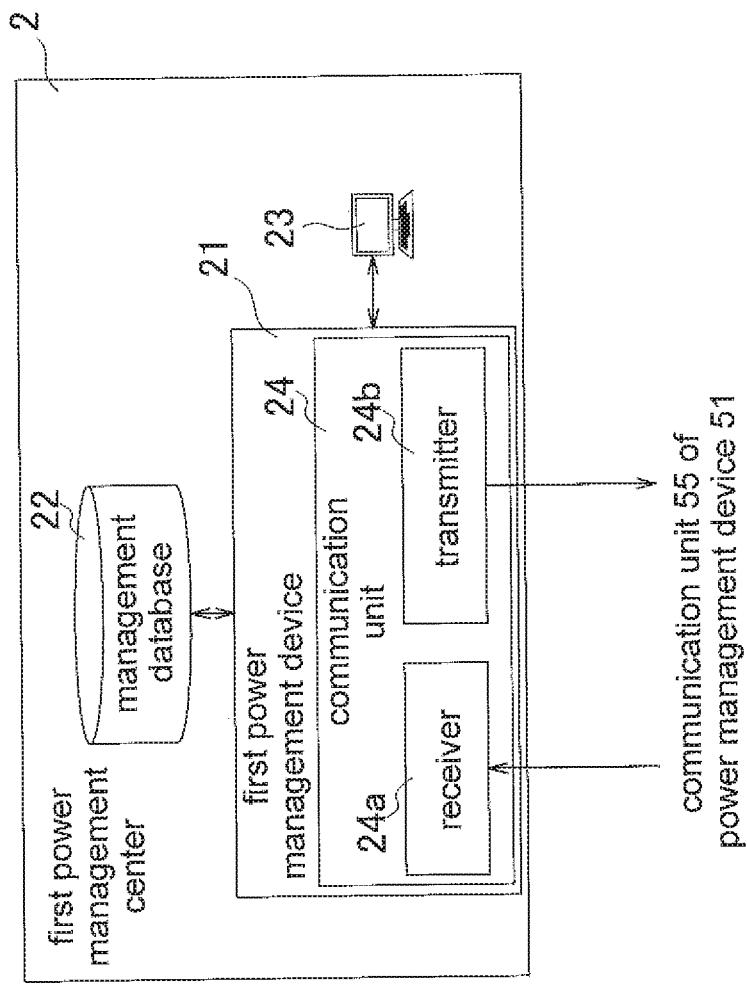
FIG. 3 is a block diagram of the configuration of a first power management center included in the power distribution network system in FIG. 1.

As shown in FIG. 3, the first power management device 21 has a communication unit 24 including a receiver 24a and a transmitter 24b, and communicates with the power management center 5 provided in each of the blocks A and B. The first power management device 21 uses the communication unit 24 to receive the abnormality detection result data obtained by each power management device 51, stores the data in the management database 22, and displays it on the display unit 23.

The abnormality detection result data includes data such as the ID and position of the CT sensor 7 which measured the measurement data in which the abnormality was detected, and the measurement time of the measurement data in which the abnormality was detected.

Thus leaving a record of abnormality detection in the management database 22 makes it possible for the host power management centers 2 and 3 to take some kind of measure against an abnormality that has occurred in the power distribution network 100 (see FIG. 2), so maintenance and management can be performed more easily than in the past.

The second power management center 3 has the same configuration as that of the first power management center 2, and will therefore not be described again in detail.

More specifically, like the first power management center 2, the second power management center 3 has a second power management device 31 having a communication unit provided with a transmitter and a receiver, as well as a management database 32 and a display unit 33, as shown in FIG. 1.

Also, the second power management center 3 communicates with the power management center 5 provided in block C, and stores information related to abnormalities detected by the power management center 5.

Power Management Center 5

As shown in FIG. 1, the power management center 5 has a power management device 51 and a display unit 52.

The power management device 51 uses the image including the data collection relay 6 received from the camera 8 and the measurement result data received from the data collection relay 6 to detect an abnormality in the power distribution network 100 (see FIG. 2). The abnormality detection processing performed by the power management device 51 will be described in detail below.

Figure 4:
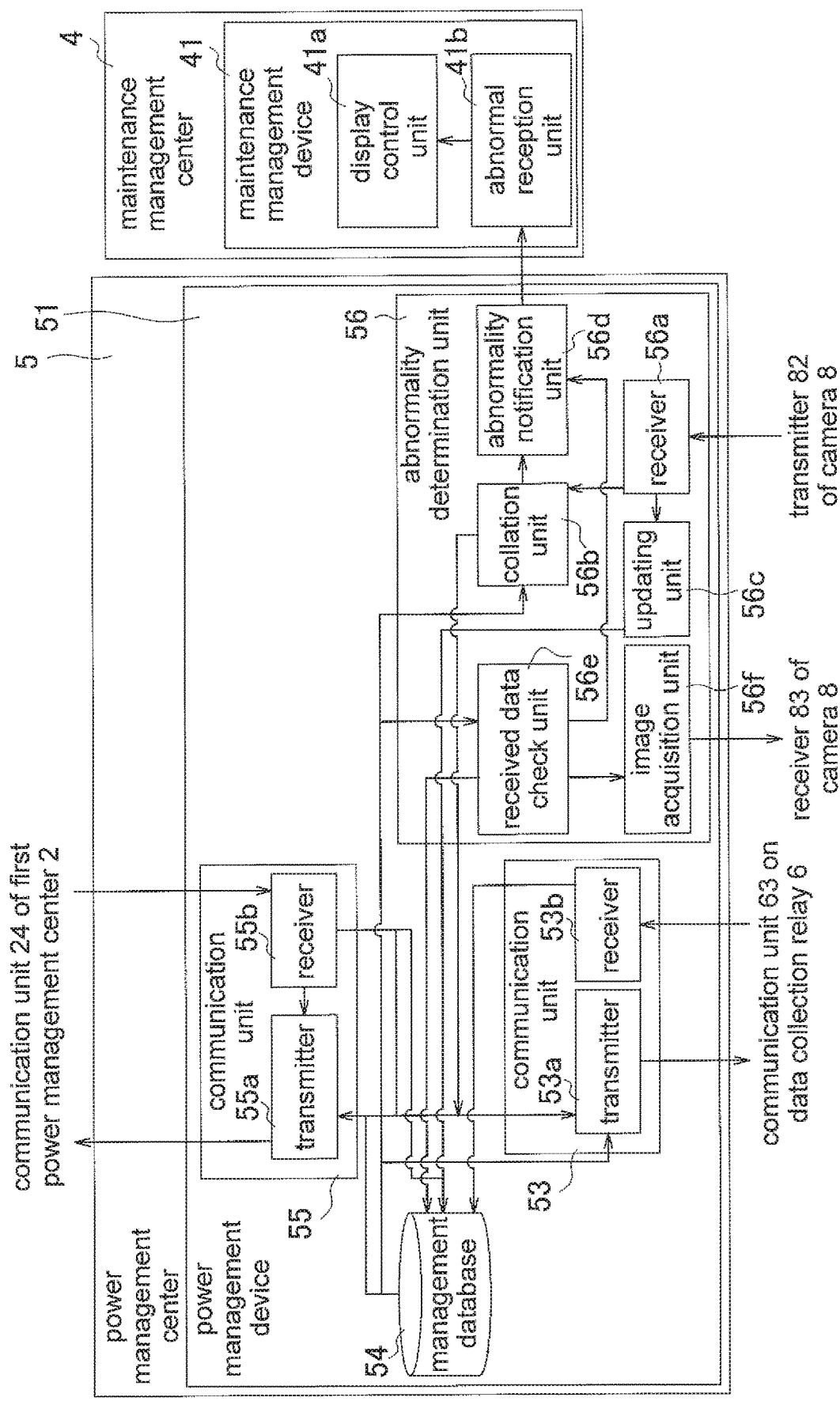
FIG. 4 is a block diagram of the configuration of a power management center included in the power distribution network monitoring system in FIG. 1.

FIG. 4 is a block diagram of the configuration of the power management center 5 and the maintenance management center 4.

As shown in FIG. 4, the power management device 51 included in the power management center 5 has a communication unit 53, a management database (an example of a storage unit) 54, a communication unit 55, and an abnormality determination unit (an example of an abnormality detector) 56.

The communication unit 53 communicates with the communication unit 63 (see FIG. 5) on the data collection relay 6 side. The communication unit 53 has a transmitter 53*a* and a receiver 53*b*, as shown in FIG. 4.

The transmitter 53*a* transmits a setting request and a data acquisition request to each data collection relay 6.

The receiver 53*b* receives various data, such as the area code, the relay management code, the CT sensor ID, the time information, and the measurement result transmitted from the transmitters 63*b* (see FIG. 5) of the plurality of data collection relays 6.

The management database 54 stores various data, such as the area code, relay management code, camera ID, CT sensor ID, time information, and measurement result received from the data collection relay 6 via the receiver 53*b*.

In this embodiment, data about the measurement result is transmitted from the CT sensor 7 to the data collecting relay 6 every six minutes, and a data acquisition request is transmitted from the power management device 51 to the data collecting relay 6 every 60 minutes.

Consequently, data about the measurement results for ten times are transmitted all at once from the data collection relay 6 to the power management device 51.

Also, in this embodiment, data about images including the data collection relay 6 taken at predetermined time intervals (such as 60 minutes) is transmitted from the camera 8 to the power management device 51.

Consequently, image data captured every 60 minutes is sequentially transmitted to the power management device 51 and stored in the management database 54.

The management database 54 stores data about the measurement result (the effective value of the current, etc.) and data about the images captured by the camera 8 as a table along with the area code, relay management code, camera ID, CT sensor ID, and time information.

In particular, in this embodiment, the management database 54 also stores information related to the result of abnormality detection (whether or not there is an abnormality, and the data collection relay 6 in which the abnormality was detected).

More specifically, setting information received from the first power management center 2 shown in FIG. 6 is stored in the management database 54.

This setting information includes relay management codes (A01_01, . . . , A01_n) and (A02_01, A02_02, . . . , A02_n) corresponding to the area code (A01) and the area code (A02), CT sensor IDs (001, 002, . . . , 00*n*) and (001, 002, . . . , 00*n*), and time information (2017/2/6 09:58:55).

The setting information is updated whenever new setting information is received from the first power management center 2.

Furthermore, the management database 54 stores the measurement information received from the data collection relay 6 shown in FIG. 7.

This measurement information includes relay management codes (A01_01, A01_2) and (A02_01) corresponding to the area code (A01) and the area code (A02), CT sensor IDs (001, 002, . . . ) and (001), time information, and measurement results.

The table in FIG. 7 shows that data indicating 10 measurement results (100 mA, 101 mA, . . . , 104 mA) was received in the 60-minute period from 09:02:30 on Feb. 6, 2017, to 09:56:30 on the same day from the CT sensor 7 with the CT sensor ID 001 that communicates with the data collection relay 6 with the relay management code A01_01, in the area with the area code A01.

Also, the table in FIG. 7 shows that some kind of abnormality has occurred in the power distribution network 100 (see FIG. 2), such as theft, damage, or failure of the CT sensors 7 or the data collection relays 6, or a power outage in the area with the area code A01, because only one measurement result has been received within 60 minutes (during the 9:00 hour on Feb. 6, 2017) from the CT sensor 7 with the CT sensor ID 002 that communicates with the data collection relay 6 with the relay management code A01_01, in the area with the area code A01.

Furthermore, the management database 54 stores image information about images including the data collection relays 6 received from the camera 8 as shown in FIG. 8.

As shown in FIG. 8, this image information includes a unique camera ID assigned to each camera 8 that has captured an image, acquisition (capture) time information, and camera images.

More specifically, the table shown in FIG. 8 holds the image data captured at the acquisition time 2017/2/6, 09:00:

00 by the camera 8 with the camera ID (CA01_01), and the image data captured at the acquisition time 2017/2/6, 09:00:10 by the camera 8 with the camera ID (CA01-02).

This image information is stored corresponding to the latest image captured by each camera 8, and is updated when new image information is received from the camera 8.

The communication unit 55 communicates with the communication unit 24 (see FIG. 3) on the first power management center 2 side. As shown in FIG. 4, the communication unit 55 has a transmitter 55*a* and a receiver 55*b*.

The transmitter 55*a* transmits various data to the receiver 24*a* included in the communication unit 24 on the first power management center 2 side.

The receiver 55*b* receives various data and commands transmitted from the transmitter 24*b* included in the communication unit 24 on the first power management center 2 side.

The abnormality determination unit 56 uses the images including the data collection relay 6 acquired by the cameras 8 to detect abnormalities from a change in the appearance of the data collection relays 6. Also, the abnormality determination unit 56 detects an abnormality in the power distribution network 100 (see FIG. 2) on the basis of the number of times the measurement result data stored in the management database 54 has been acquired.

More specifically, the abnormality determination unit 56 compares, for example, two images including the data collection relay 6 captured by the camera 8 ten minutes apart, detects changes such as when the housing that accommodates the data collection relay 6 is open, and thereby determines whether or not there is an abnormality related to the data collection relay 6.

Also, the abnormality determination unit 56 confirms whether or not the number of receptions of the measurement result produced by a CT sensor 7 in 60 minutes (a predetermined length of time) is ten times (a predetermined number of times). If ten measurement results have not been received, the abnormality determination unit 56 determines that some kind of abnormality has occurred in the power distribution network.

Here, abnormalities that are detected by the power distribution network monitoring system 1 of this embodiment include, for example, theft, damage, failure, or the like of a data collection relay 6 that can be determined from a change in the appearance of the data collection relay 6. Furthermore, in this embodiment, for example, theft, damage, or failure of the CT sensor 7 and the data collection relay 6, a communication abnormality between the CT sensor 7 and the data collection relay 6, a communication failure between the data collection relay 6 and the power management device 51, a power outage, and other such abnormalities are also included.

That is, when the data collection relay 6 is in a state in which an abnormality such as theft, destruction, or failure has occurred, it is assumed that there will be a change in the appearance, such as the data collection relay 6 disappearing from the image, or the formation of a dent or broken portion.

For this reason, with the power distribution network monitoring system 1 of this embodiment, the presence or absence of an abnormality related to the data collection relay 6 is determined using two images captured ten minutes apart.

Also, if one of these abnormalities has occurred in the power distribution network 100 (see FIG. 2) in which a plurality of CT sensors 7 are installed, the measurement results in the CT sensors 7 will not be transmitted to the power management device 51.

Accordingly, with the power distribution network monitoring system 1 of this embodiment, data about the effective value related to the measurement results transmitted via the data collection relay 6 for each individual CT sensor 7 for which measurement is performed every six minutes is acquired for 60 minutes, and the presence or absence of an abnormality is determined according to whether or not the number of measurements is ten times.

As shown in FIG. 4, the abnormality determination unit 56 has a receiver 56*a*, a collation unit 56*b*, an updating unit 56*c*, an abnormality notification unit (an example of a reporting unit) 56*d*, a received data check unit 56*e*, and an image acquisition unit 56*f*.

The receiver 56*a* receives, from a transmitter 82 of the camera 8, data about the image including the data collection relay 6 captured by the camera 8. The receiver 56*a* then transmits the image data received from the camera 8 to the collation unit 56*b* and the updating unit 56*c*.

Here, the image data received by the receiver 56*a* is transmitted to the management database 54 via the updating unit 56*c* and stored in the management database 54.

The collation unit 56*b* compares two sets of image data including the latest image data received from the receiver 56*a* and the image data captured immediately before (ten minutes before) and taken out of the management database 54, and then detects any change in the appearance of the data collection relay 6. When the collation unit 56*b* detects that there is a change in the appearance of the data collection relay 6 in the image, it is determined that an abnormality has occurred in the data collection relay 6. Furthermore, the collation unit 56*b* transmits the determination result that there is an abnormality to the abnormality notification unit 56*d* and the transmitters 53*a* and 55*a* of the communication units 53 and 55.

Upon receiving image data via the receiver 56*a*, the updating unit 56*c* updates the image data stored in the management database 54 to the latest image data. Consequently, the latest image data is always stored in the management database 54.

On the basis of the determination result at the collation unit 56*b* and the received data check unit 56*e* that there is an abnormality, the abnormality notification unit 56*d* transmits abnormality determination information, including the relay management code of the data collection relay 6 in which the abnormality has occurred, the CT sensor IDs of the plurality of CT sensors 7 connected to that data collection relay 6, the area code where the CT sensors 7 are installed, and so forth, to the abnormality receiver 41*b* of the maintenance management center 4.

The received data check unit 56*e* extracts the number of receptions of the measurement results of the CT sensors 7 received via the receiver 53*b* of the communication unit 53 from the management database 54 and checks this number to determine whether or not the number of receptions is a preset predetermined number of times.

More specifically, the received data check unit 56*e* confirms whether or not 60 minutes' worth of measurement results by the CT sensors 7 (ten times if normal) have been received.

Here, if ten sets of measurement data have not been received in 60 minutes, the received data check unit 56*e* determines that some kind of abnormality has occurred in the power distribution network 100 (see FIG. 2), and the measurement result data and the determination result are transmitted to the image acquisition unit 56*f* and the abnormality notification unit 56*d*.

The image acquisition unit 56f transmits an image acquisition request signal to the receiver 83 of each camera 8 at predetermined time intervals (for example, 60 minutes). Consequently, each camera 8 captures an image including the data collection relay 6 at the point when the image acquisition request signal is received.

Maintenance Management Center 4

The maintenance management center 4 performs maintenance management of the power distribution network 100 on the basis of the notification of abnormality detection result data from the power management center 5. That is, the maintenance management center 4 performs management such as dispatching a worker to actually check the installation location of the CT sensor 7 that has transmitted data such as a measurement result in which an abnormality was detected. As shown in FIG. 1, the maintenance management center 4 has a maintenance management device 41 and a display unit 42.

As shown in FIG. 4, the maintenance management device 41 has a display controller 41a and an abnormality receiver 41b.

The display controller 41a causes the display unit 42 to display the ID and so forth of the CT sensor 7, the data collection relay 6, etc., in which an abnormality has occurred, on the basis of the result of the abnormality detection received from the abnormality notification unit 56d of the abnormality determination unit 56 (see FIG. 1).

The abnormality receiver 41b receives data related to the result of the abnormality detection transmitted from the abnormality notification unit 56d of the power management device 51, and the like.

The display unit 42 is controlled by the display controller 41a so as to display data about the measurement results of each CT sensor 7, image information or text information indicating the occurrence of an abnormality that can be determined from the appearance of the data collection relay 6, text information indicating occurrence of an abnormality in the power distribution network 100, etc. Consequently, the manager can confirm the abnormality detection result and so forth displayed on the display unit 42, and can perform maintenance and management such as dispatching a worker to the site as needed.

Camera 8

Figure 5:
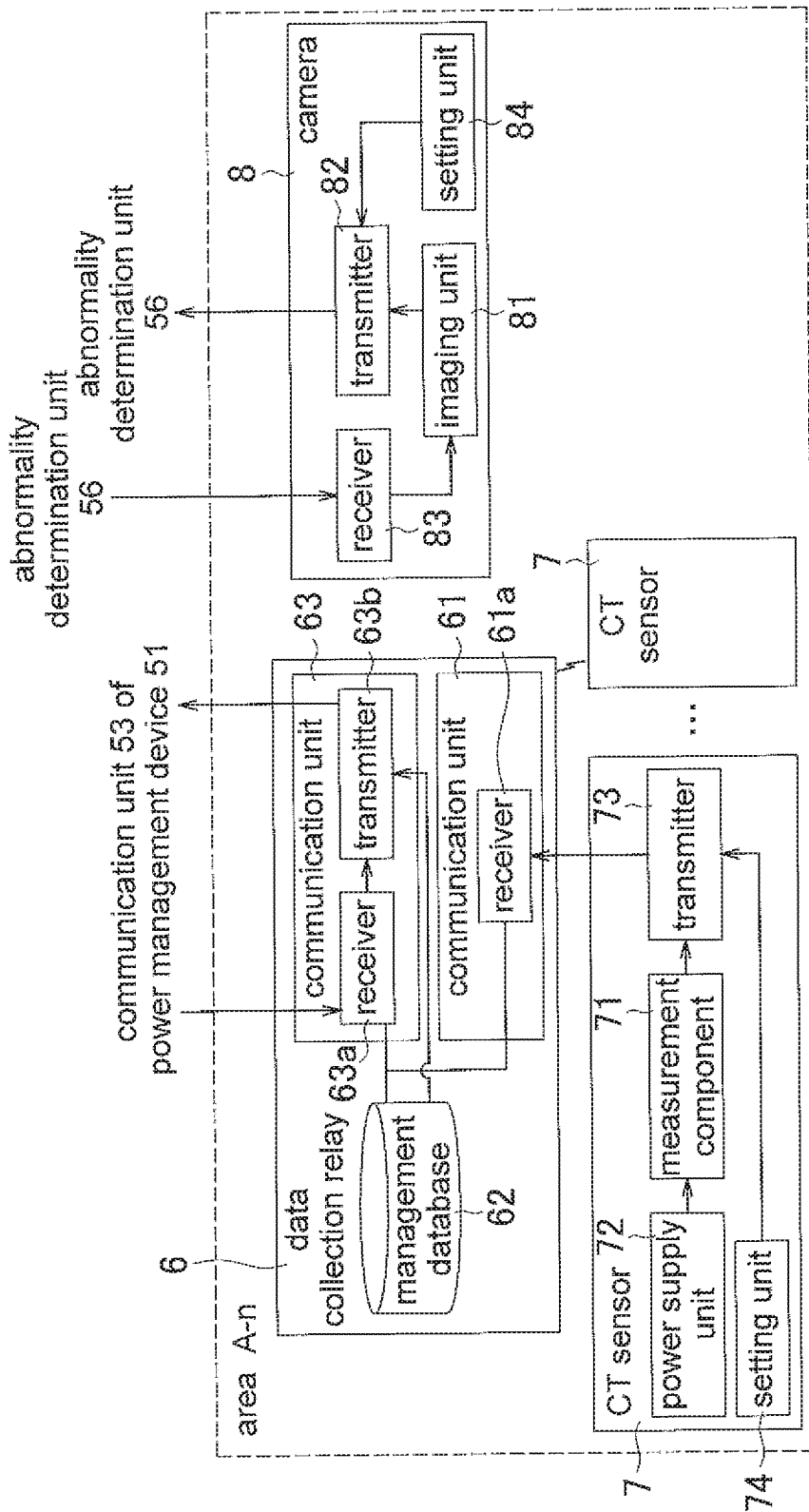
FIG. 5 is a block diagram of the configuration of a data collection relay, a CT sensor, and a camera included in the power distribution network monitoring system in FIG. 1.

FIG. 5 is a block diagram of the configuration of the data collection relay 6, the CT sensor 7, and the camera 8 in the area A-n.

The camera 8 is disposed near the data collection relay 6 as shown in FIG. 2, and captures an image including the data collection relay 6 at predetermined time intervals.

As shown in FIG. 5, the camera 8 has an imaging unit 81, a transmitter 82, a receiver 83, and a setting unit 84.

The imaging unit 81 captures an image including the data collection relay 6 at predetermined time intervals (for example, 60 minutes). The imaging unit 81 then transmits the captured image data to the transmitter 82.

The transmitter 82 transmits the image data received from the imaging unit 81 to the abnormality determination unit 56 of the power management device 51 along with a unique camera ID assigned to each camera 8 and acquisition (capture) time information.

The receiver 83 receives an image acquisition request signal from the image acquisition unit 56f of the abnormality determination unit 56. The receiver 83 then transmits a command to capture an image including the data collection relay 6 to the imaging unit 81 at the point when the image acquisition request signal is received.

The setting unit 84 receives various information such as a camera ID unique to each camera 8.

CT Sensor 7

As shown in FIG. 2, the CT sensor 7 has a clip-type attachment structure, and can be removably attached to the distribution lines 103, 104, 105, 106, etc. Accordingly, there is a risk that the CT sensors 7 attached to the distribution lines 103 to 106, etc., may be subjected to theft, damage, or the like.

As shown in FIG. 5, the CT sensor 7 includes a measurement component 71, a power supply unit 72, a transmitter 73, and a setting unit 74.

The measurement component 71 measures the trend of the current flowing through the distribution line due to the power supply from the power supply unit 72. More specifically, the measurement component 71 has a coil unit removably attached around the distribution line, a shunt resistor for measuring the current flowing through the coil unit, and so forth. Therefore, the measurement component 71 can sense the current flowing through the distribution line by measuring the voltage at both ends of the shunt resistor.

Also, the measurement component 71 is provided with an operation unit (not shown), and the effective value of the current is calculated from the waveform of the sensed current.

The power supply unit 72 functions as a power supply that stores the electricity generated in the coil unit and supplies it to the measurement component 71. A component is provided for switching the electrical circuit so that when power is stored in the power supply unit 72, measurement is not performed by the measurement component 71, and the current produced by the coil unit is sent to the power supply unit 72.

The setting unit 74 sets the area code in which a CT sensor 7 is installed, a management code for identifying a communicable data collection relay 6, a CT sensor ID for identifying a CT sensor 7, the measurement time, the measurement interval, the number of measurements, etc.

The transmitter 73 transmits the data (effective value of current, etc.) measured and calculated by the measurement component 71 as measurement result data to the data collection relay 6. This measurement result data is used for detecting abnormalities in the power management device 51.

In addition to the measurement result data, the transmitter 73 transmits as measurement information the sensor ID, time information, and the like set by the setting unit 74, in association with the measurement result data.

The time information transmitted in association with the measurement result data indicates the time at which the measurement result data was measured at each CT sensor 7. The CT sensor 7 transmits the sensor ID, time information, and measurement result data to the data collecting relay 6 periodically, such as at six-minute intervals.

Data Collection Relay 6

As shown in FIG. 5, the data collection relay 6 has a communication unit 61, a management database 62, and a communication unit 63.

The communication unit 61 performs wireless communication with the plurality of CT sensors 7. The communication unit 61 has a receiver 61a.

The receiver 61a receives the measurement information (sensor ID, time information, and measurement result data) transmitted from the plurality of CT sensors 7 via wireless communication.

The management database 62 stores (as a table) and manages the setting information (see the table in FIG. 9) and measurement information (see table in FIG. 10) transmitted from the plurality of CT sensors 7.

More specifically, the management database 62 stores the setting information received from the power management device 51 shown in FIG. 9.

This setting information includes the CT sensor IDs (001, 002, ..., 00n) corresponding to the relay's own relay management code (A01_01), and time information (2017/2/6, 10:00:08).

This setting information is updated whenever new setting information is received from the power management device 51.

Furthermore, the measurement information received from the plurality of CT sensors 7 shown in FIG. 10 is stored in the management database 62.

This measurement information includes CT sensor IDs (001, 002, 003, ...), time information, and measurement results.

The table in FIG. 10 shows that data indicating ten measurement results (100 mA, 101 mA, ..., 104 mA) was received in the 60-minute period from 09:02:30 on Feb. 6, 2017, to 09:56:30 on the same day from the CT sensor 7 with the CT sensor ID 001.

Also, the table in FIG. 10 shows that data indicating two measurement results was received between 09:03:42 and 09:09:42 on Feb. 6, 2017, from the CT sensor 7 with the CT sensor ID 001. That is, this means that only two measurement results were received in 60 minutes from the CT sensor 7 with the CT sensor ID 002.

As shown in FIG. 1, the communication unit 63 communicates with the power management device 51 in block A, etc. The communication unit 63 has a receiver 63a and a transmitter 63b.

The receiver 63a receives a setting request and a data acquisition request from the power management device 51 of the power management center 5. The data acquisition request is transmitted periodically (for example, every 60 minutes) from the power management center 5. The setting request requests the setting of the ID of the data collection relay 6.

The transmitter 63b transmits the sensor ID, the time information, the measurement result data, and the data collection relay ID to the power management device 51 of the power management center 5.

Flow of Abnormality Detection Processing

The flow of processing for abnormality detection in the power distribution network 100 (see FIG. 2) by the power distribution network monitoring system 1 of this embodiment will now be described.

Processing in CT Sensor 7

Figure 11:
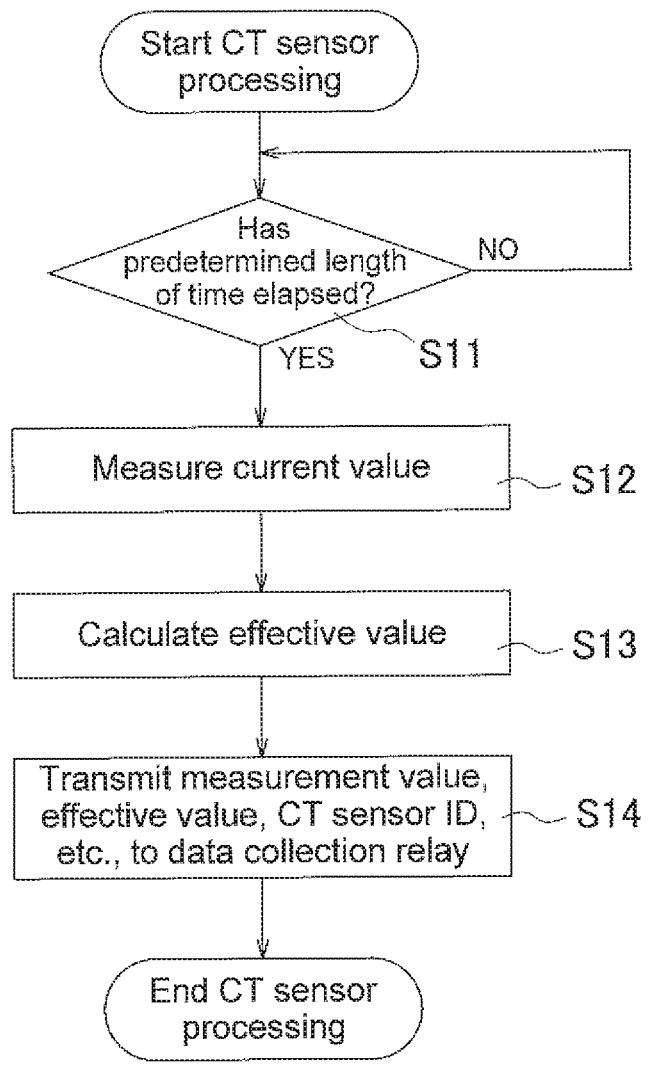
FIG. 11 is a flowchart of the flow of processing in a CT sensor included in the power distribution network monitoring system in FIG. 1.

As shown in FIG. 11, in step S11 the CT sensor 7 determines whether or not a predetermined, preset length of time (such as six minutes) has elapsed. The system waits until the predetermined length of time has elapsed, and once it has, the flow proceeds to step S12.

The predetermined length of time set here corresponds to how long charging is performed at the power supply unit 72.

Next, in step S12 the measurement component 71 of the CT sensor 7 measures the value of the current flowing through the distribution line (an example of a power line).

Next, in step S13 an operation unit (not shown) of the CT sensor 7 calculates the effective value from the measured current value.

Next, in step S14 measurement information including the measurement value measured by the measurement component 71, the effective value calculated by the operation unit, the unique CT sensor ID assigned to each CT sensor 7, and so forth is transmitted by the transmitter 73 of the CT sensor 7 to the data collection relay 6.

Processing at Data Collection Relay 6

Figure 12:
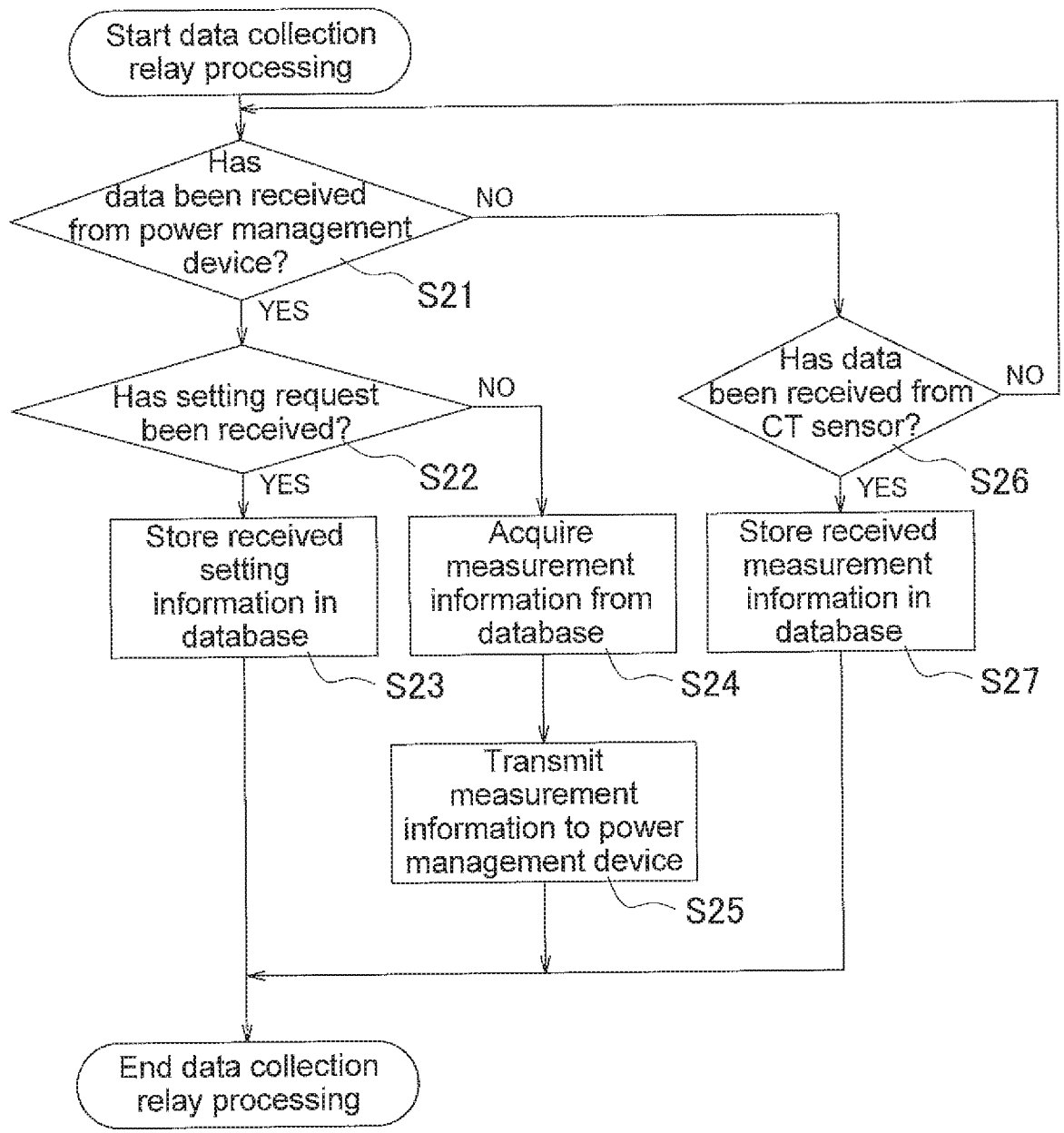
FIG. 12 is a flowchart of the flow of processing in a data gathering relay included in the power distribution network monitoring system in FIG. 1.

As shown in FIG. 12, in step S21 the data collection relay 6 determines whether or not the receiver 63a of the communication unit 63 has received data from the power management device 51. If data has been received from the power management device 51, the flow proceeds to step S22. On the other hand, if no data has been received from the power management device 51, the flow proceeds to step S26.

Next, in step S22, if data has been received from the power management device 51, it is determined whether or not the data includes a setting request. Here, if the data includes a setting request, the flow proceeds to step S23. On the other hand, if the data does not include a setting request, the flow proceeds to step S24.

Next, in step S23, if data has been received from the power management device 51 and it includes a setting request, the information included in the received setting request is stored in the management database 62, and the processing is ended.

Next, in step S24, if data has been received from the power management device 51 and a setting request is not included, measurement information related to the current value (effective value) measured by the CT sensor 7 is acquired from the management database 62.

Next, in step S25 the measurement information is transmitted from the transmitter 63b of the communication unit 63 to the power management device 51 (the receiver 53b of the communication unit 53), and the processing is ended.

Next, in step S26, if data has not been received from the power management device 51, it is determined whether or not data has been received from the CT sensor 7. Here, if data has been received from the CT sensor 7, the flow proceeds to step S27. On the other hand, if data has not been received from the CT sensor 7, the flow returns to step S21.

Next, in step S27, if data has not been received from the power management device 51, but data has been received from the CT sensor 7, the received measurement information is stored in the management database 62, and the processing is ended.

Processing in Camera 8

Figure 13:
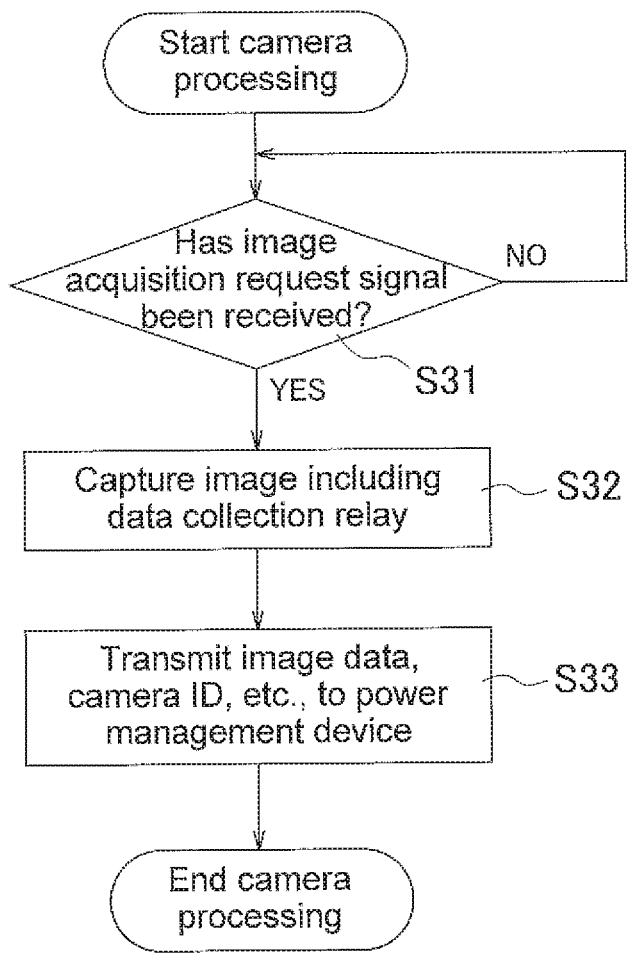
FIG. 13 is a flowchart of the flow of processing in a camera included in the power distribution network monitoring system in FIG. 1.

As shown in FIG. 13, in step S31 the camera 8 determines whether or not an image acquisition request signal has been received from the abnormality determination unit 56 of the power management device 51, that is, whether or not a preset, predetermined length of time (for example, 60 minutes) has elapsed. Here, the system waits for an image acquisition request signal to be received (until the predetermined length of time has elapsed), and once an image acquisition request signal is received, the flow proceeds to step S32.

The reception interval time for the image acquisition request signal set here corresponds to the abnormality determination time for performing an abnormality determination using the image from the camera 8.

Next, in step S32 the camera 8 captures an image including the data collection relay 6.

Next, in step S33 the image data captured by the camera 8 is transmitted to the power management device 51 along with the unique camera ID assigned to each camera 8 and image acquisition (capture) time information.

Processing in Power Management Device 51

Figure 14:
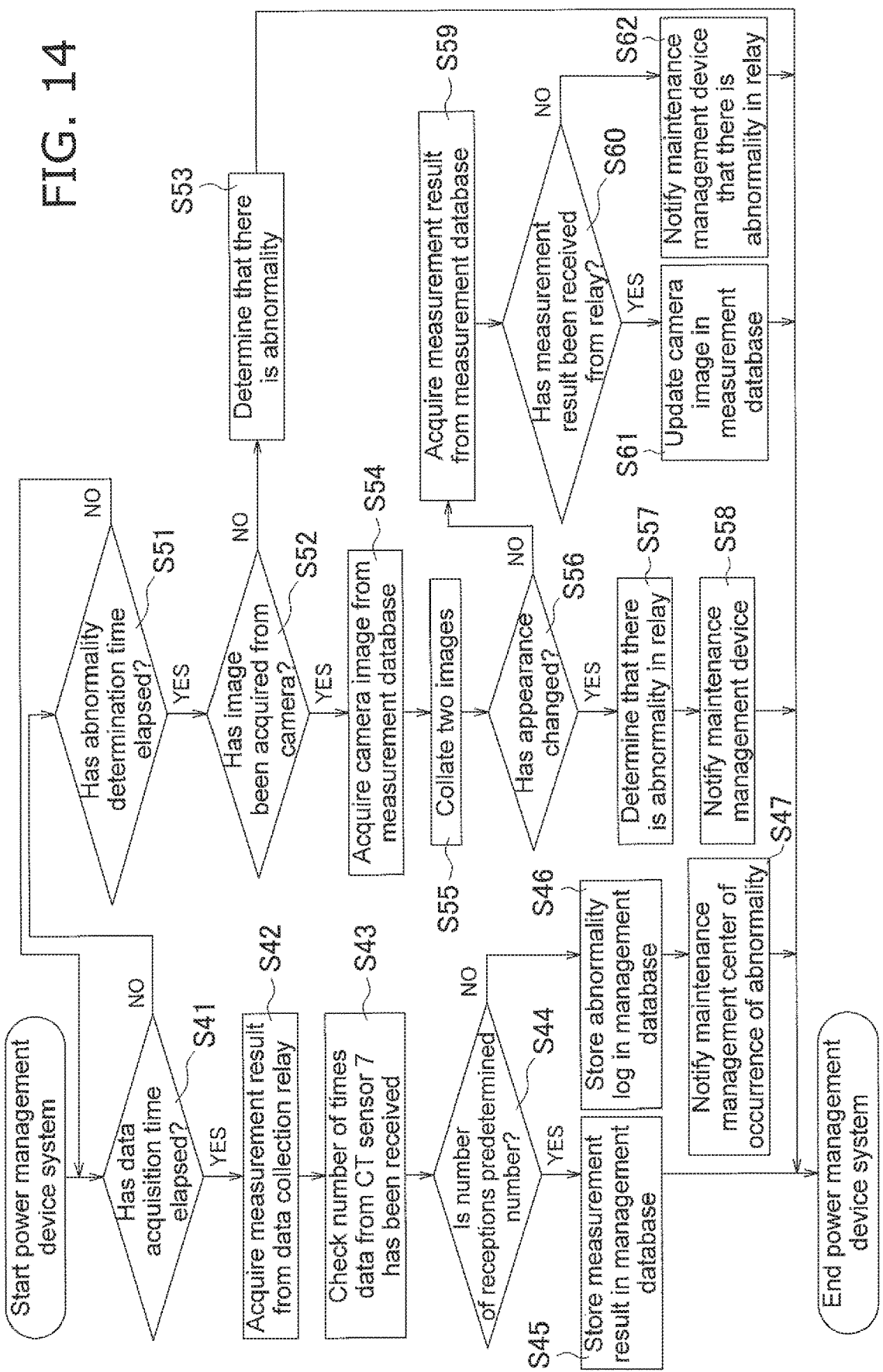
FIG. 14 is a flowchart of the flow of processing in abnormality determination by the power distribution network monitoring system in FIG. 1.

As shown in FIG. 14, in step S41 the power management device 51 determines whether or not a preset data acquisition time (such as 60 minutes) has elapsed. If the data acquisition time has elapsed, the flow proceeds to step S42.

If, however, the data acquisition time has not elapsed, the flow proceeds to step S51 in order to perform abnormality determination using the image captured by the camera 8.

Next, in step S42, since the data acquisition time has elapsed, 60 minutes' worth of measurement results (ten times if normal) by the CT sensor 7 are acquired from the transmitter 63b of the communication unit 63 of the data collection relay 6 by the receiver 53b of the communication unit 53.

Next, in step S43 the received data check unit 56e of the abnormality determination unit 56 checks the number of times the measurement result of the CT sensor 7 has been received.

Next, in step S44, as a result of confirmation at the received data check unit 56e, it is determined whether or not the number of receptions is equal to a predetermined, preset number.

More specifically, in this embodiment, the abnormality determination unit 56 acquires data about measurement results corresponding to 60 minutes. Measurement of the current value in the CT sensor 7 is performed every six minutes. Therefore, if the communication status between the CT sensor 7 and the data collection relay 6 is normal, data for ten measurement results in 60 minutes should be included.

Here, if the number of times of times the measurement result has been received at the CT sensor 7 is the specified number of times (ten), the flow proceeds to step S45. On the other hand, if it is not the predetermined number of times (less than ten), the flow proceeds to step S46.

Next, in step S45 it is confirmed that the measurement results of the CT sensor 7 have been received a predetermined number of times (ten times) within a predetermined length of time (60 minutes), so it is determined that no abnormality has occurred (normal), the measurement result is stored in the management database 54, and the processing is ended.

On the other hand, in step S46, it has been confirmed that the measurement results of the CT sensor 7 have not been received a predetermined number of times (ten) within a predetermined length of time (60 minutes), so it is determined that an abnormality has occurred, and information (a log) of the abnormality determination and the measurement result are stored in the management database 54.

Next, in step S47 the abnormality notification unit 56d notifies the maintenance management device 41 of the occurrence of an abnormality in the power distribution network 100 (see FIG. 2), and the processing is ended.

On the other hand, if it is determined in step S41 that the data acquisition time has not elapsed, it is determined in step S51 whether or not a preset abnormality determination time has elapsed. Here, if the abnormality determination time has elapsed, the flow proceeds to step S52. On the other hand, if the abnormality determination time has not elapsed, the flow returns to step S41.

Next, in step S52, since the abnormality determination time has elapsed, the receiver 56a of the abnormality determination unit 56 determines whether or not an image or other data has been acquired from the camera 8. If an image or other data has been acquired from the camera 8, the flow proceeds to step S54. On the other hand, if an image or other data has not been acquired from the camera 8 even though the abnormality determination time has elapsed, it is considered that an abnormality has occurred, such as communication failure between the camera 8 and the power management device 51, or failure of the camera 8, so the flow proceeds to step S53.

Next, in step S53, if data such as an image has not been received from the camera 8 even though the abnormality determination time has elapsed, it is determined that an abnormality has occurred, such as theft, damage, or failure of the camera 8, or a communication failure between the camera 8 and the power management device 51, and the processing is ended.

Next, in step S54, since the abnormality determination time has elapsed and data such as an image has been acquired from the camera 8, the latest image captured by the same camera 8 immediately before is taken from the management database 54.

Next, in step S55 the image acquired from the camera 8 and the latest image taken from the management database 54 are collated.

Next, in step S56 the collation unit 56b compares the two images to determine whether or not there is a change in the appearance of the data collection relay 6 included in the images. Here, if it is determined that there is a change in the appearance of the data collection relay 6, that is, that there is an abnormality in the appearance, the flow proceeds to step S57. On the other hand, if it is determined that there is no change in the appearance of the data collection relay 6, that is, that there is no abnormality in the appearance, the flow proceeds to step S59.

Here, in the determination by the collation unit 56b, it is determined whether or not the appearance of the data collection relay 6 has changed. More specifically, if it is found that the data collection relay 6 has disappeared from the image, the collation unit 56b determines that there is an abnormality in the data collection relay 6, such as theft or damage. Also, if the data collecting relay 6 is installed in its housing, and if a state is detected in which the door of the housing is open, the collation unit 56b determines that there is an abnormality in the data collection relay 6, such as theft or damage.

Next, in step S57, as a result of comparing the two images taken by the camera 8, it is determined that there is an abnormality in the data collection relay 6 because the appearance of the data collection relay 6 has changed.

Next, in step S58 the abnormality notification unit 56d notifies the abnormality receiver 41b of the maintenance management device 41 to the effect that it has been determined that there is an abnormality by using the two images, and the processing is ended.

Next, in step S59, as a result of the determination using the two images, the appearance of the data collection relay 6 is determined not to have changed and to be normal, so the measurement result at the CT sensor 7 is received from the management database 54.

Next, in step S60 the measurement result received from the management database 54 is used to determine whether or not the measurement result of the CT sensor 7 has been received from the data collection relay 6. If the measurement result has been received from the data collecting relay 6, the flow proceeds to step S61. On the other hand, if the measurement result has not been received from the data collection relay 6, the flow proceeds to step S62.

Next, in step S61, since the measurement result of the CT sensor 7 has been received from the data collection relay 6, it is determined that there is no abnormality in the data collection relay 6, the management database 54 updates the image of the camera 8 with the latest data, and the processing is ended.

Next, in step S62, since the measurement result at the CT sensor 7 has not been received from the data collection relay 6, it is determined that some kind of abnormality has occurred in the data collection relay 6, the maintenance management device 41 is notified that there is an abnormality, and the processing is ended.

With the power distribution network monitoring system 1 in this embodiment, with the above configuration, a plurality of images taken by the camera 8 disposed near the data collection relay 6 are compared, and if a change is detected in the appearance of the data collection relay 6, it is determined that an abnormality has occurred in the data collection relay 6.

Consequently, the occurrence of an abnormality related to the data collection relay 6 can be reported by transmitting information related to the occurrence of the abnormality to the maintenance management center 4 or the like, for example, and maintenance and management can be easily performed.

Also, with the power distribution network monitoring system 1 in this embodiment, it is determined whether or not various abnormalities have occurred, such as theft, damage, or failure of the CT sensor 7 or the data collection relay 6, depending on whether or not the number of receptions of data related to the measurement result in the CT sensor 7 is a predetermined number of times.

Consequently, the occurrence of an abnormality in the power distribution network 100 (see FIG. 2) in which the CT sensor 7 is installed can be reported by transmitting information related to the occurrence of the abnormality to the maintenance management center 4 or the like, for example, and maintenance and management can be easily performed.

Also, with the power distribution network monitoring system 1 in this embodiment, in determining an abnormality, the approximate position where the abnormality has occurred can be easily identified on the basis of the unique ID assigned to the CT sensor 7 in which the abnormality has occurred, the ID of the data collection relay 6 to which this CT sensor 7 is connected, the area where the CT sensor 7 is installed, and other such information.

As a result, when some kind of abnormality occurs in the power distribution network 100, maintenance and management of the power distribution network 100 can be performed more easily than in the past, such as checking around that position.

Other Embodiments

An embodiment of the present invention was described above, but the present invention is not limited to or by the above embodiment, and various modifications are possible without departing from the gist of the invention.

(A)

In the above embodiment, an example was given in which the present invention was applied to the power distribution network monitoring system 1 that included the CT sensors 7 and the data collection relays 6, but the present invention is not limited to this.

Figure 15:
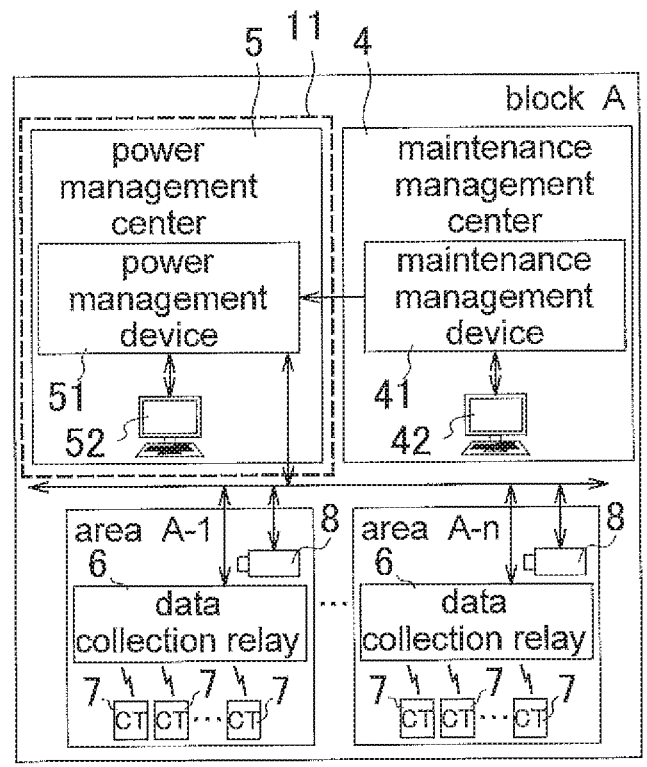
FIG. 15 is a block diagram of the configuration of the power distribution network monitoring apparatus according to another embodiment of the present invention.

For example, as shown in FIG. 15, the present invention may be realized as a power distribution network monitoring device 11 that does not include CT sensors or data collection relays.

More specifically, the power distribution network monitoring device 11 uses the image including the data collection relay 6 received from the camera 8 and the measurement result of the CT sensor 7 received from the data collection relay 6 to detect the occurrence of an abnormality in the power distribution network.

Consequently, the same effect as that of the power distribution network monitoring system 1 in Embodiment 1 can be obtained.

(B)

In the above embodiment, an example was given in which position information about the CT sensor 7 is not included in the information stored in the management database 54 of the power management device 51. However, the present invention is not limited to this.

For instance, as shown in FIGS. 16A to 16C, a position code indicating position information about the data collection relay, the camera, and the CT sensor may be stored in the management database in an associated state.

More specifically, in the table shown in FIG. 16A, a relay management code unique to each data collection relay and position information (position codes) corresponding thereto are shown. Also, in the table shown in FIG. 16B, a camera ID unique to each camera and position information (position codes) corresponding thereto are shown. Furthermore, in the table shown in FIG. 16C, the area code in which the CT sensor is installed, the CT sensor ID unique to each CT sensor, and position information (position codes) corresponding thereto are shown.

In this case, by referring to the position information stored in the management database, it is possible to easily recognize the installation locations of the CT sensor and the data collection relay where an abnormality has occurred, so a worker can be instructed to go to the site of the abnormality.

(C)

In the above embodiment, an example was given in which the occurrence of an abnormality in the power distribution network was detected using images captured by the camera 8 disposed near the data collection relay 6 and the number of receptions of measurement results at the CT sensor 7 received via the data collection relay 6. However, the present invention is not limited to this.

For instance, the configuration may be such that the occurrence of an abnormality in the data collection relay is detected using only the images captured by the camera 8 disposed near the data collection relay 6.

(D)

In the above embodiment, an example was given in which the occurrence of an abnormality in the data collection relay 6, such as theft, damage, or failure, was detected using images including the data collection relay captured by the camera 8. However, the present invention is not limited to this.

For instance, the occurrence of an abnormality such as the theft, damage, or failure of not only a data collection relay, but also a CT sensor may be detected by using images including the CT sensor to detect a change in the appearance of the CT sensor.

Alternatively, instead of the data collection relay, an image including only the CT sensor may be used to detect a change in appearance of the CT sensor and detect the occurrence of an abnormality such as theft, damage, or failure of the CT sensor.

(E)

In the above embodiment, an example was given in which data for an image captured by the camera 8 was transmitted directly from the camera 8 to the abnormality determination unit 56 of the power management device 51. However, the present invention is not limited to this.

For instance, image data may be transmitted indirectly from the camera to the abnormality determination unit of the power management device via a data collection relay or the like.

(F)

In the above embodiment, an example was given in which the abnormality determination unit 56 compared two images, namely, the latest image captured by the camera 8 and stored in the management database 54, and the image received from the camera 8 via the receiver 56a, and the presence or absence of an abnormality in the data collection relay 6 was determined. However, the present invention is not limited to this.

For instance, three or more images may be used for abnormality determination in the abnormality determination unit.

In this case, since a change in the appearance of the data collection relay can be detected more accurately in time series, the occurrence of an abnormality in the data collection relay can be detected more accurately.

(G)

In the above embodiment, an example was given in which the effective value was calculated from the current value measured at the CT sensor 7, and the effective value was transmitted to the power management device 51 via the data collection relay 6 as data related to the measurement result. However, the present invention is not limited to this.

For instance, the result of an electrical measurement other than the effective value, such as the current value or voltage value, may be used as data related to the measurement result.

(H)

In the above embodiment, an example was given in which the abnormality determination unit 56 of the power management device 51 detected the presence or absence of an abnormality in the power distribution network 100 according to whether or not the number of times the measurement result of the CT sensor 7 was acquired in 60 minutes was ten times. However, the present invention is not limited to this.

For instance, the predetermined length of time used for abnormality determination is not limited to 60 minutes, and may be set to a time shorter than 60 minutes, such as 10 minutes or 30 minutes. Alternatively, it may be set to a time longer than 60 minutes, such as 3 hours, 6 hours, 12 hours, or 24 hours.

Also, the predetermined number of times used for abnormality determination is not limited to ten times in 60 minutes, and the appropriate number of times may be set to two times in ten minutes, or three times in 30 minutes, for example. Alternatively, if the predetermined length of time is longer than 60 minutes, such as 3 hours, 6 hours, 12 hours, or 24 hours, the number of times may be to more than 10 times, such as 20 times or 30 times.

(I)

In the above embodiment, an example was given in which, when the abnormality determination unit 56 of the power management device 51 determined that an abnormality had occurred, information indicating the occurrence of the abnormality was transmitted to the maintenance management center 4 via the abnormality notification unit 56d, and text information indicating the occurrence of the abnormality was displayed on the display unit 42 in the maintenance management center 4. However, the present invention is not limited to this.

For instance, the method of reporting when an abnormality occurs is not limited to displaying text information on the display unit 42 of the maintenance management center 4, and some other reporting means may be employed instead, such as generating a warning sound or sending an email to a portable terminal or the like of a worker who performs maintenance management.

(J)

In the above embodiment, an example was given in which wireless communication was used for communication between the plurality of CT sensors 7 and the data collection relay 6, between the data collection relay 6 and the power management device 51, and between the camera 8 and the power management device 51. However, the present invention is not limited to this.

For instance, wired communication may be performed between the plurality of CT sensors 7 and the data collection relay 6, and/or between the data collection relay 6 and the power management device 51, and/or between the camera 8 and the power management device 51.

(K)

In the above embodiment, an example was given in which a CT sensor 7 having the power supply unit 72 and the like was used as a measuring instrument for measuring the current value of a distribution line (power line) constituting the power distribution network has been described. However, the present invention is not limited to this.

For instance, another measuring instrument such as a current sensor having a power supply unit may be used.

(L)

In the above embodiment, an example was given in which CT sensors 7 were used to measure the current value of the distribution lines (power lines) 103 to 106 constituting the power distribution network 100. However, the present invention is not limited to this.

For instance, the electrical measurement performed by the measuring instrument is not limited to the measurement of the current value, and may be some other electrical measurement such as a voltage value.

INDUSTRIAL APPLICABILITY

The power distribution network monitoring system of the present invention has the effect of being able to effectively detect the occurrence of abnormalities in a power distribution network including power lines to which current sensors and data collection relays are attached, and therefore can be broadly applied to systems that manage various kinds of power distribution network.

REFERENCE SIGNS LIST

1 power distribution network monitoring system
2 first power management center
3 second power management center
4 maintenance management center
5 power management center
6, 6a, 6b data collection relay
7, 7a to 7g CT sensors (measuring instruments)
8, 8a, 8b camera (imaging unit)
10 power distribution network system
11 power distribution network monitoring device
21 first power management device
22 management database
23 display unit
31 second power management device
32 management database
33 display unit
41 maintenance management device
41a display controller
41b abnormality receiver
42 display unit
51 power management device
52 display unit
53 communication unit 53a transmitter
53b receiver
54 management database (storage unit)
55 communication unit
55a transmitter
55b receiver
56 abnormality determination unit (abnormality detector)
56a receiver
56b collation unit
56c updating unit
56d abnormality notification unit (reporting unit)
56e received data check unit
56f image acquisition unit
61 communication unit
61a receiver
62 management database
63 communication unit
63a receiver
63b transmitter
71 measurement component
72 power supply unit
73 transmitter
74 setting unit
81 imaging unit
82 transmitter
83 receiver
84 setting unit
100 power distribution network
101, 102 power pole
103, 104, 105, 106 distribution line (power line)
107 house

The invention claimed is:

1. A power distribution network monitoring system, comprising:
   a plurality of measuring instruments that are installed at predetermined positions on power lines constituting a power distribution network and configured to perform electrical measurement of the power lines;
   a data collection relay configured to receive data related to measurement results from the plurality of measuring instruments;
   an imaging unit that is disposed near the data collection relay and configured to capture an image of the data collection relay;
   an abnormality detector configured to detect an abnormality with respect to the data collection relay; and
   a storage unit configured to store image data taken by the imaging unit, wherein the image data consists of a single image previously captured by the imaging unit;
   wherein the abnormality detector compares the latest image captured by the imaging unit and the image data stored by the storage unit and determines whether or not an appearance of the data collection relay changes,
   if there is no change in the appearance of the data collection relay, the image data in the storage unit is updated with the latest image captured by the imaging unit.

2. The power distribution network monitoring system according to claim 1,
   wherein the imaging unit is provided in a one-to-one correspondence with respect to the data collection relay.

3. The power distribution network monitoring system according to claim 1,
   wherein the imaging unit transmits unique ID information assigned to each of the imaging units, along with data for the image.

4. The power distribution network monitoring system according to claim 1,
   wherein the abnormality detector receives data related to the measurement result measured in the measuring instrument from the data collection relay, determines whether or not the data has been received a predetermined number of times within a predetermined length of time, and detect abnormalities related to the measuring instruments.

5. The power distribution network monitoring system according to claim 4,
   wherein the plurality of measuring instruments perform electrical measurement of the power lines each time a predetermined length of time elapses.

6. The power distribution network monitoring system according to claim 4,
   wherein the measuring instruments transmit unique ID information assigned to each of the measuring instruments, along with data related to the measurement result.

7. The power distribution network monitoring system according to claim 4,
   wherein the measuring instrument transmits position information indicating the place where the measuring instrument is installed, along with data related to the measurement result.

8. The power distribution network monitoring system according to claim 4,
   wherein the measuring instrument transmits time information indicating the date and time when the measurement was performed in the measuring instrument, along with data related to the measurement result.

9. The power distribution network monitoring system according to claim 1,
   wherein the data collection relay includes a first data collection relay that receives data related to the measurement results from the plurality of measuring instruments installed in a first area, and a second data collection relay that receives data related to the measurement results from the plurality of measuring instruments installed in a second area.

10. The power distribution network monitoring system according to claim 1,
    wherein the storage unit stores data related to the measurement results of the plurality of measuring instruments received from the data collection relay, and a detection result of the abnormality.

11. The power distribution network monitoring system according to claim 1,
    wherein the abnormalities include failure, theft, or destruction of the data collection relay or the measurement instrument, a power outage in the power distribution network, and communication failure between the measurement instrument, the data collection relay, and the abnormality detector.

12. The power distribution network monitoring system according to claim 1,
    further comprising a reporting unit configured to give a report related to an abnormality in the event that the abnormality detector determines that there is an abnormality.

13. A power distribution network monitoring device, comprising:
    an imaging unit that is disposed near a data collection relay for capturing an image of the data collection relay, where the data collection relay is installed at a predetermined position on a power line constituting a power distribution network and configured to receive data related to measurement results from a plurality of measuring instruments that perform electrical measurement of the power line; and an abnormality detector configured to use the image captured by the imaging unit to detect an abnormality in the data collection relay, the abnormality detector compares two images including the latest image received from the imaging unit and a previously captured image stored in a storage unit and determines whether or not an appearance of the data collection relay changes, if there is no change in the appearance of the data collection relay, the previously captured image in the storage unit is updated to the latest image.

* * * * *